United States Patent
Takasu

(10) Patent No.: US 8,907,443 B2
(45) Date of Patent: Dec. 9, 2014

(54) SEMICONDUCTOR DEVICE

(75) Inventor: Hiroaki Takasu, Chiba (JP)

(73) Assignee: Seiko Instruments Inc., Chiba (JP)

( * ) Notice: Subject to any disclaimer, the term of this patent is extended or adjusted under 35 U.S.C. 154(b) by 325 days.

(21) Appl. No.: 12/191,661

(22) Filed: Aug. 14, 2008

(65) Prior Publication Data

US 2009/0050966 A1 Feb. 26, 2009

(30) Foreign Application Priority Data

Aug. 22, 2007 (JP) ................. 2007-215947

(51) Int. Cl.
*H01L 21/70* (2006.01)
*H01L 27/02* (2006.01)
*H01L 29/78* (2006.01)
*H01L 29/66* (2006.01)

(52) U.S. Cl.
CPC ............ *H01L 29/78* (2013.01); *H01L 27/0266* (2013.01)
USPC ........... 257/506; 257/213; 257/343; 257/173; 257/E29.015; 257/E29.181

(58) Field of Classification Search
CPC . H01L 27/0248; H01L 21/76; H01L 29/7846; H01L 29/7834
USPC .......... 257/565, 368, 347, 192, 140, E21.602, 257/E25.023, E25.01, E27.001, 499, 491, 257/173–175, 213, 327, 339, 343, 346, 355, 257/360, 361, 374, 409, 487, 452, 501, 506, 257/510, 618, E29.014, E29.015, E29.018, 257/E29.02, E29.021, E29.026; 361/56; 438/149, 163, 425

See application file for complete search history.

(56) References Cited

U.S. PATENT DOCUMENTS

| | | | |
|---|---|---|---|
| 5,451,799 A * | 9/1995 | Kurimoto et al. ............. | 257/174 |
| 5,757,038 A * | 5/1998 | Tiwari et al. .................. | 257/192 |
| 5,844,275 A * | 12/1998 | Kitamura et al. ............. | 257/335 |
| 5,937,283 A * | 8/1999 | Lee ............................... | 438/149 |
| 6,033,941 A * | 3/2000 | Yang ............................. | 438/163 |
| 6,337,230 B2 * | 1/2002 | Hirano ......................... | 438/149 |
| 6,537,861 B1 * | 3/2003 | Kroell et al. ................. | 438/149 |
| 6,624,487 B1 * | 9/2003 | Kunz et al. ................... | 257/409 |
| 6,660,602 B1 * | 12/2003 | Vashchenko et al. ......... | 438/301 |
| 6,683,352 B2 * | 1/2004 | Hsieh et al. .................. | 257/377 |
| 6,905,919 B2 * | 6/2005 | Chan et al. ................... | 438/151 |

(Continued)

FOREIGN PATENT DOCUMENTS

JP 2002-231886 A 8/2002

OTHER PUBLICATIONS

Sze. Semiconductor Devices Physics and Technology, 2nd Edition, p. 186.*

(Continued)

*Primary Examiner* — Galina Yushina
(74) *Attorney, Agent, or Firm* — Brinks Gilson & Lione

(57) ABSTRACT

In order to suppress an off leak current of an off transistor for ESD protection, in an NMOS for ESD protection whose isolation region has a shallow trench structure, a drain region is placed apart from the shallow trench isolation region so as not to be in direct contact with the shallow trench isolation region in a region where the drain region of the NMOS transistor for ESD protection is adjacent to at least a gate electrode of the NMOS transistor for ESD protection.

1 Claim, 3 Drawing Sheets

(56) References Cited

U.S. PATENT DOCUMENTS

| | | | |
|---|---|---|---|
| 7,093,215 B2* | 8/2006 | Sahara et al. | 716/4 |
| 2002/0000618 A1* | 1/2002 | Saito et al. | 257/368 |
| 2002/0053717 A1* | 5/2002 | Sumida | 257/565 |
| 2002/0074606 A1* | 6/2002 | Mosher | 257/368 |
| 2002/0105766 A1* | 8/2002 | Lin et al. | 361/56 |
| 2002/0175372 A1* | 11/2002 | Takizawa | 257/347 |
| 2003/0202311 A1* | 10/2003 | Duvvury | 361/111 |
| 2004/0213029 A1* | 10/2004 | Hirata et al. | 365/104 |
| 2006/0079063 A1* | 4/2006 | Abe | 438/373 |
| 2006/0128087 A1* | 6/2006 | Bamji et al. | 438/199 |
| 2006/0166459 A1* | 7/2006 | Ohashi et al. | 438/425 |
| 2006/0289936 A1* | 12/2006 | Kao | 257/357 |
| 2007/0020795 A1* | 1/2007 | Mori et al. | 438/57 |
| 2007/0187784 A1* | 8/2007 | Wu et al. | 257/412 |
| 2007/0200157 A1* | 8/2007 | Shino | 257/296 |
| 2008/0203470 A1* | 8/2008 | Willmeroth et al. | 257/328 |

OTHER PUBLICATIONS

Office Action from counterpart Chinese Application No. 200810168672.8, dated Jul. 18, 2011, 5 pages.

* cited by examiner

SEMICONDUCTOR DEVICE

RELATED APPLICATIONS

This application claims priority under 35 U.S.C. §119 to Japanese Patent Application No. JP2007-215947 filed on Aug. 22, 2007, the entire content of which is hereby incorporated by reference.

BACKGROUND OF THE INVENTION

1. Field of the Invention

The present invention relates to a semiconductor device having metal oxide semiconductor (MOS) transistors isolated by shallow trench structure, and using an n-type MOS (NMOS) transistor as an electrostatic discharge (hereinafter, referred to as ESD) protection element.

2. Description of the Related Art

In a semiconductor device having MOS transistors, an off transistor, which is an NMOS transistor provided in an off-state whose gate potential is fixed to a ground (Vss), is used as an ESD protection element for preventing breakdown of an internal circuit due to static electricity supplied from a pad provided for external connection.

Since the off transistor must flow a large amount of current generated by static electricity at once unlike ordinary MOS transistors forming an internal circuit such as a logic circuit, a large width (width W) of about several hundred micrometers is required for the transistor in many cases.

Though the gate potential of the off transistor is fixed to Vss to hold the off transistor in an off-state, the threshold voltage is less than 1 V as in the NMOS transistors constituting the internal circuit, permitting generation of subthreshold current to some extent. The width W of the off transistor is large as described above, and thus an off leak current at standby during operation becomes larger, which leads to a problem of increase in the current consumption at standby during operation of the entire integrated circuit (IC) carrying the off transistor.

In particular, in the case of a semiconductor device in which a shallow trench is used for device isolation, there is a problem in that an area adjacent to the shallow trench includes a region such as a crystal defect layer or the like which easily generates leak current, arising from the structure itself or a manufacturing method thereof. Further, off leak current of the off transistor poses much more serious problems.

As a measure to reduce the leak current of the protection element, it is proposed to provide a plurality of transistors between the power line (Vdd) and the ground (Vss) so as to completely cut the current path therebetween (for example, see FIG. 1 of JP 2002-231886 A).

However, when the width W is made small to reduce the off leak current of the off transistor, protection function cannot be sufficiently implemented. Besides, in the semiconductor device in which a plurality of transistors are provided to cut the current path between the power line (Vdd) and the ground (Vss) as proposed in JP 2002-231886 A, an occupation area thereof increases because the semiconductor device includes the plurality of transistors, leading to an increase in cost of the semiconductor device.

SUMMARY OF THE INVENTION

In order to solve the aforementioned problems, a semiconductor device according to the present invention is structured as follows.

In the semiconductor device including an NMOS transistor for ESD protection surrounded by a shallow trench for device isolation, formed between an external connection terminal and an internal circuit region to protect an internal element formed in the internal circuit region from ESD breakdown, a drain of the NMOS transistor for ESD protection is disposed apart from the shallow trench isolation region, at least in a region adjacent to the gate electrode.

Further, the drain region of the NMOS transistor for ESD protection is placed, at least in the region adjacent to the gate electrode of the NMOS transistor for ESD protection, with at least a distance equal to or longer than a gate length of the NMOS transistor for ESD protection from the shallow trench.

Further, the drain region of the NMOS transistor for ESD protection is placed, at least in the region adjacent to the gate electrode of the NMOS transistor for ESD protection, apart from the shallow trench, and the semiconductor device further includes a separation region provided between the shallow and the drain region of the NMOS transistor for ESD protection, the separation region being formed in a self-alignment manner with respect to a region where the gate electrode of the NMOS transistor for ESD protection is extended.

Through the means as described above, there can be obtained a semiconductor device including an NMOS transistor for ESD protection provided with a sufficient ESD protection function while keeping the off leak current small by preventing the generation of the leak current characteristic to the shallow trench isolation structure or by avoiding a region which generates leak current, without increasing manufacturing steps or an occupation area thereof.

DETAILED DESCRIPTION OF THE PREFERRED EMBODIMENTS

First Embodiment

Figure 1:
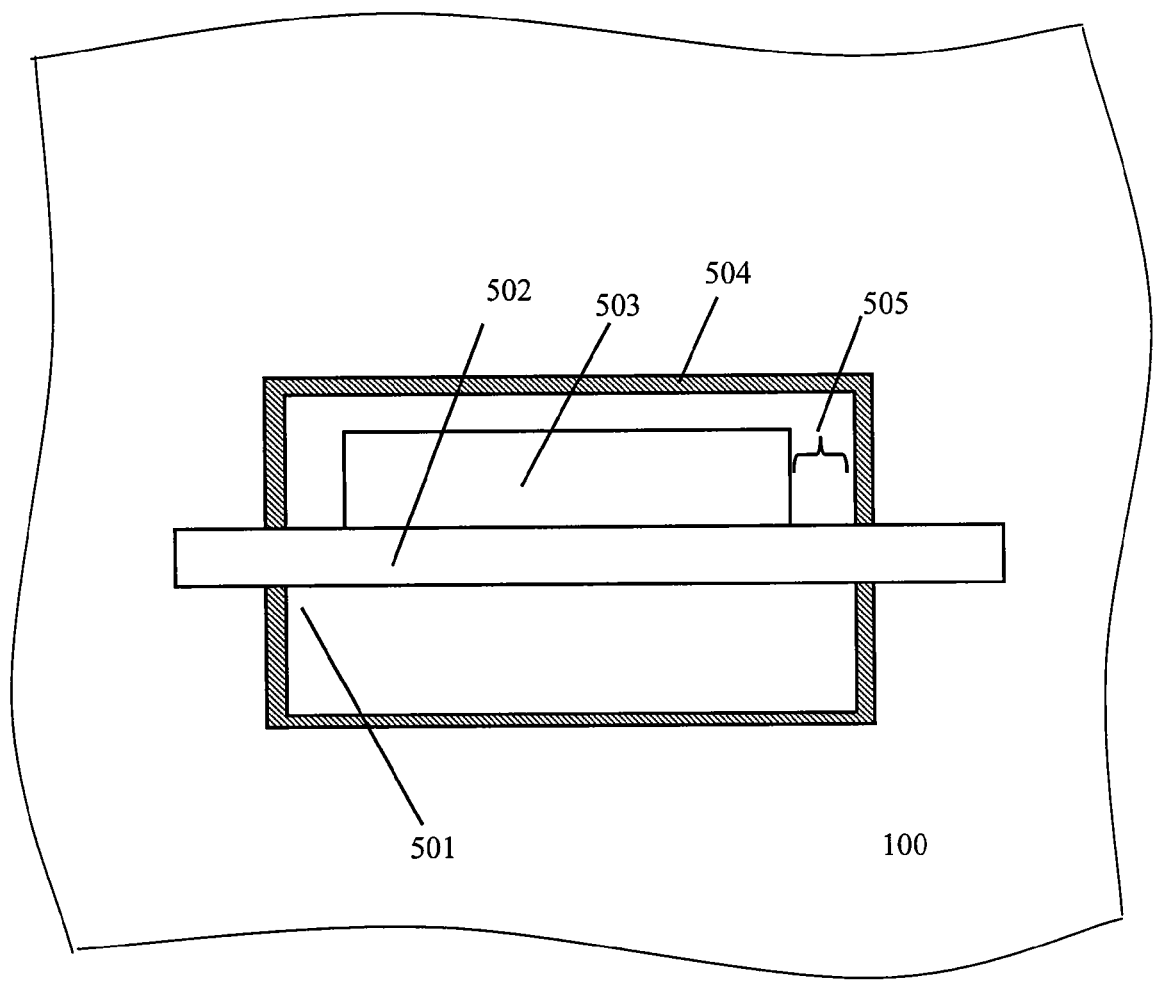
FIG. 1 is a schematic plan view showing an NMOS transistor for ESD protection of a semiconductor device according to a first embodiment of the present invention.

FIG. 1 is a schematic plan view showing an NMOS transistor for ESD protection of a semiconductor device according to a first embodiment of the present invention.

A pair of a source region 501 and a drain region 503 which are formed of an n-type heavily-doped impurity region are arranged on a p-type semiconductor substrate 100, a gate insulating film (not shown) made of a silicon oxide film or the like is placed between the source region 501 and the drain region 503, and a gate electrode 502 made of a polysilicon or the like is formed on an upper surface of the gate insulating film. A shallow trench structure is used for insulation from other elements, and a perimeter of the transistor is surrounded by a shallow trench isolation region 504. In this case, the drain region 503 is placed apart from the shallow trench isolation region 504, and a separation region 505 is formed between the drain region 503 and the shallow trench isolation region 504.

A region adjacent to the shallow trench isolation region 504 is a region including a crystal defect layer or the like which easily generates leak current caused by the isolation structure itself or a manufacturing method thereof, and avoidance of such a region is extremely effective in reducing the off leak current. In this case, the separation region 505 between the drain region 503 and the shallow trench isolation region 504 is preferably made to be larger than a gate length of the NMOS transistor for ESD protection, which is defined by the gate electrode 502.

A region where the largest amount of the off leak current flows in an NMOS transistor for ESD protection having a shallow trench isolation structure is a channel region under the gate electrode 502 and adjacent to the shallow trench isolation region 504. In selecting the gate length of the NMOS transistor for ESD protection, the gate length is selected to have the leak current smaller than a predetermined value. In other words, selecting the gate length in the NMOS transistor for ESD protection, the leak current can be made smaller than the predetermined value even in the channel region under the gate electrode 502 and adjacent to the shallow trench isolation region 504, which easily generates the leak current.

In the present invention, the separation region 505 between the drain region 503 and the shallow trench isolation region 504 is not the channel region under the gate electrode 502 and adjacent to the shallow trench isolation region 504, where the leak current is most likely to flow. However, making the width of the separation region 505 larger than at least the gate length of the NMOS transistor for ESD protection, which is defined by the gate electrode 502, the leak current can certainly be made smaller than the predetermined value.

FIG. 1 shows an example in which the drain region 503 is placed apart from the shallow trench isolation region 504 even in a region other than a part adjacent to the gate electrode 502. This is because, in addition to generation of the off leak current in the channel region existing under the gate electrode 502, generation of the leak current between the drain region 503 in the vicinity of the shallow trench isolation region 504 and a p-channel substrate (not shown) or a well region (not shown) is prevented. In the case where the leak current between the drain region 503 in the vicinity of the shallow trench isolation region 504 and the p-type substrate or the well region is at a level causing no problem, as described later in a third embodiment shown in FIG. 3, only a region of the drain region 503, which is adjacent to the gate electrode 502, may be placed apart from the shallow trench isolation region 504.

The source region 501 is made to have a structure to be in contact with the shallow trench isolation region 504. This is because, in the NMOS transistor for ESD protection, the source region 501 is set to be the same potential as a potential of the p-type substrate 100 or a well region (not shown). In other words, there arises no problem even if the leak current is generated between the source region 501 and the p-type substrate or the well region. When a method is employed in which the source region 501 is at a different potential from the potential of the p-type substrate or the well region, the source region 501 is preferably placed apart from the shallow trench isolation region 504, as in the drain region 503.

The example of FIG. 1 shows a case where the NMOS transistor for ESD protection has the source and the drain of a conventional structure for simplicity, but there may be also employed a lightly doped drain (LDD) structure or an offset drain structure in which the drain region 503 is apart from the gate electrode 502 with a certain width of apartness.

Second Embodiment

Figure 2:
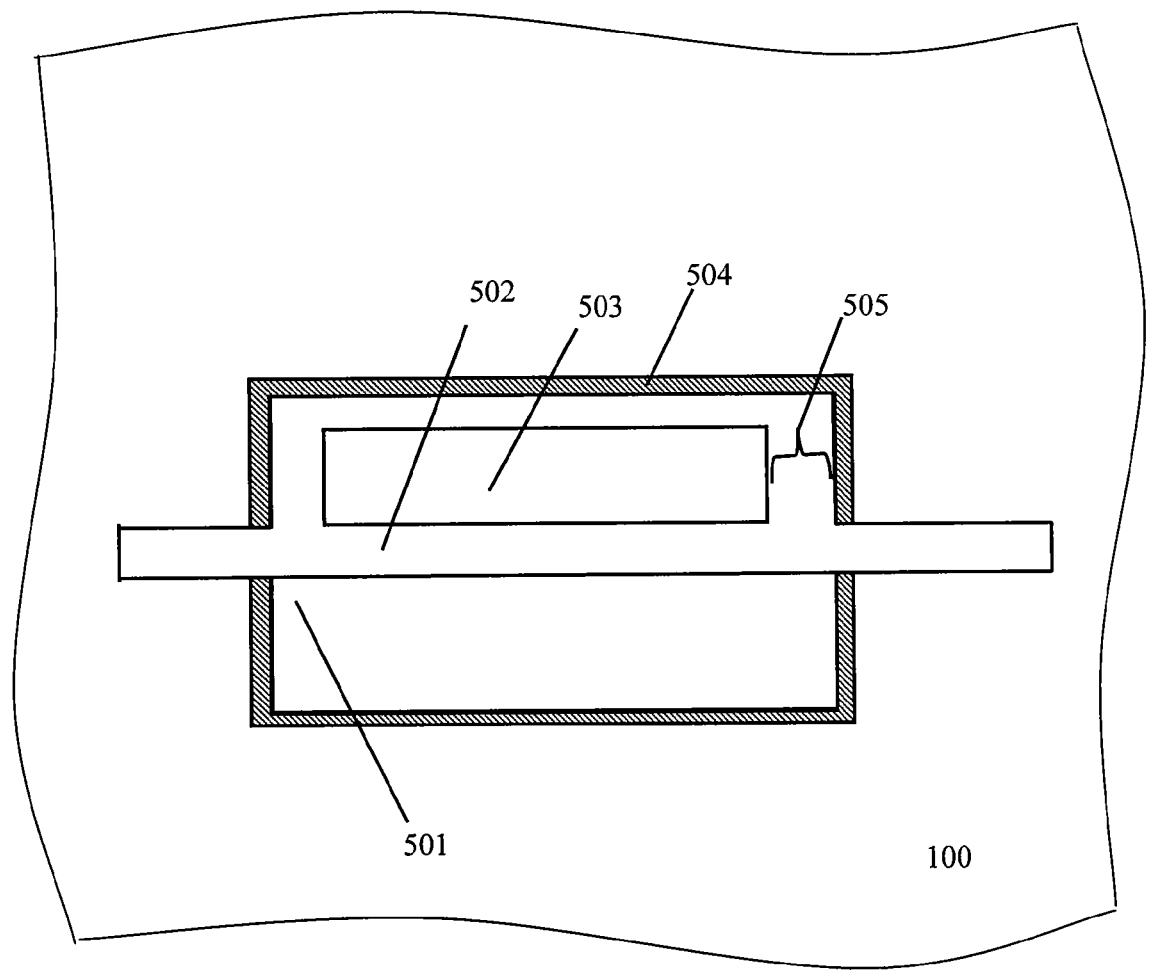
FIG. 2 is a schematic plan view showing an NMOS transistor for ESD protection of a semiconductor device according to a second embodiment of the present invention.

FIG. 2 is a schematic plan view showing an NMOS transistor for ESD protection of a semiconductor device according to a second embodiment of the present invention. The second embodiment is different from the first embodiment shown in FIG. 1 in that the separation region 505 placed between the drain region 503 and the shallow trench isolation region 504 is formed in a self-alignment manner in a region where the gate electrode 502 is extended.

In a generally-employed semiconductor manufacturing step, the gate electrode 502 is formed, and then the drain region 503 and the source region 501 are formed in a self-alignment manner with the gate electrode 502 using an ion implantation method or other methods in many cases. In the second embodiment shown in FIG. 2, in forming the drain region 503, the separation region 505 is automatically formed in the region where the gate electrode 502 is extended, with the result that the manufacturing step can be more simplified. Other parts are denoted by the same reference numerals as FIG. 1, and their descriptions are omitted.

Third Embodiment

Figure 3:
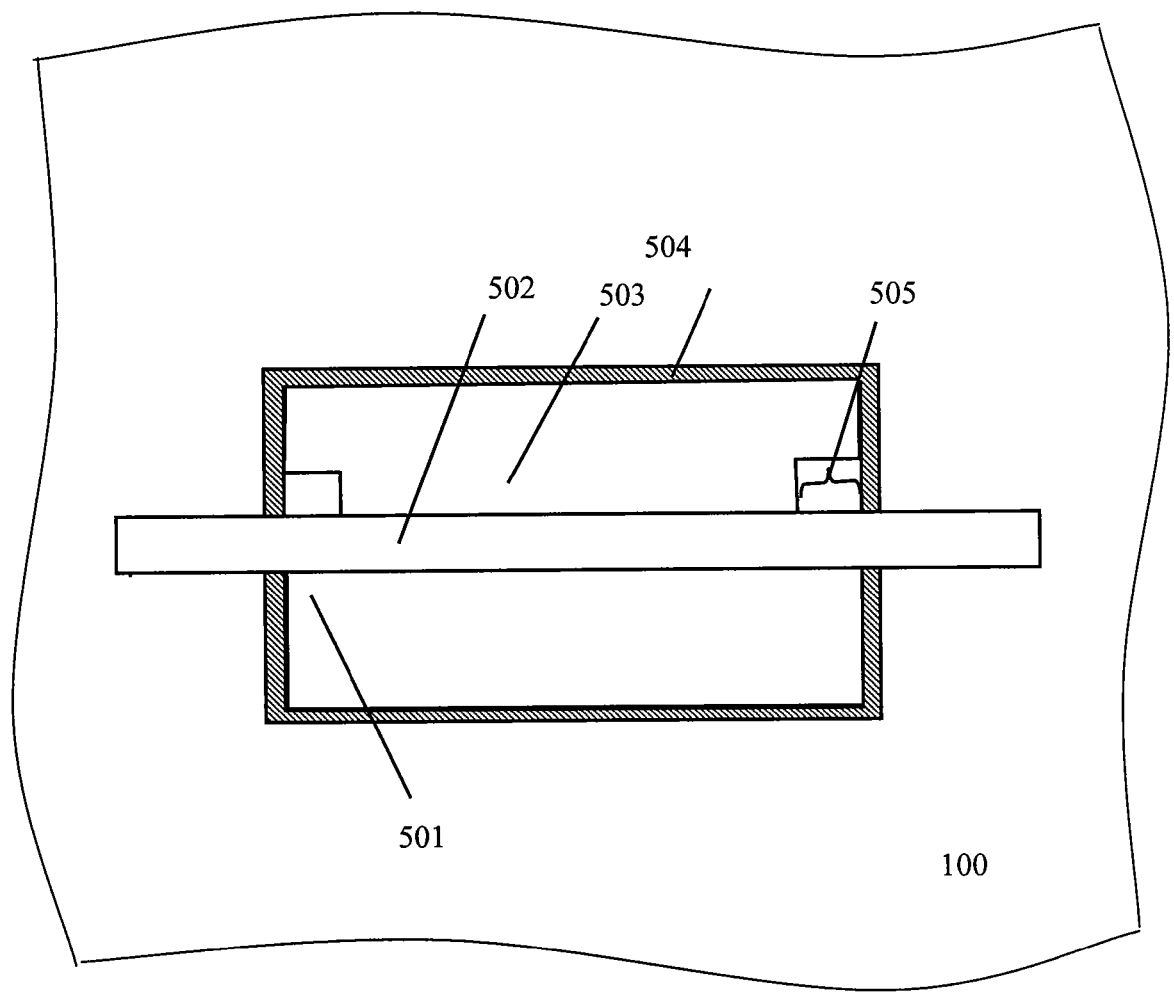
FIG. 3 is a schematic plan view showing an NMOS transistor for ESD protection of a semiconductor device according to a third embodiment of the present invention.

FIG. 3 is a schematic plan view showing an NMOS transistor for ESD protection of a semiconductor device according to a third embodiment of the present invention. The third embodiment is different from the first embodiment shown in FIG. 1 in that only regions of the drain region 503, which are adjacent to the gate electrode 502, are placed apart from the shallow trench isolation region 504.

A region of the NMOS transistor for ESD protection having the shallow trench isolation structure, where a largest amount of off leak current flows, is a channel region being adjacent to the shallow trench isolation region 504 and existing under the gate electrode 502. A junction between the drain region 503 in the vicinity of the shallow trench isolation region 504 and the p-type substrate 100 or a well region (not shown) is another part where the leak current is generated, but the leak current generated in the junction does not pose a serious problem in many cases.

The third embodiment shown in FIG. 3 is an example where only the regions of the drain region 503, which are adjacent to the gate electrode 502, are placed apart from the shallow trench isolation region 504 on the assumption that the leak current between the drain region 503 in the vicinity of the shallow trench isolation region 504 and the p-type substrate or the well region is at a level posing no problem. Other parts are denoted by the same reference numerals as FIG. 1, and their descriptions are omitted.

What is claimed is:

1. A semiconductor device comprising an n-type metal oxide semiconductor transistor for electrostatic discharge protection, the n-type metal oxide semiconductor transistor comprising:
    a semiconductor substrate;
    a shallow trench isolation region disposed on the semiconductor substrate to define a perimeter of an area for the n-type metal oxide semiconductor transistor, the shallow trench isolation region comprising a first portion and a second portion laterally adjacent to the first portion; and
    a gate electrode, a source region and a drain region, wherein at least a portion of the gate electrode overlaps the first portion of the shallow trench isolation region, and wherein a first portion of an outer edge of the drain region is separated from the second portion of the shallow trench isolation and a second portion of the outer edge of the drain region abuts with the shallow trench isolation region, and wherein a distance between the first portion of the outer edge of the drain region and the second portion of the shallow trench isolation region adjacent to the first portion of the shallow trench isolation region overlapped by the gate electrode is equal to or greater than a gate length of the n-type metal oxide semiconductor transistor, wherein the source region abuts with the shallow trench isolation region.

\* \* \* \* \*